(12) United States Patent
Choi et al.

(10) Patent No.: US 11,140,467 B2
(45) Date of Patent: Oct. 5, 2021

(54) DISPLAY APPARATUS

(71) Applicant: LG Display Co., Ltd., Seoul (KR)

(72) Inventors: ChangHee Choi, Paju-si (KR);
ChangYul Moon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/010,636

(22) Filed: Sep. 2, 2020

(65) Prior Publication Data
US 2021/0076115 A1    Mar. 11, 2021

(30) Foreign Application Priority Data
Sep. 5, 2019    (KR) ........................ 10-2019-0109887

(51) Int. Cl.
*H04R 1/02*    (2006.01)
*H05K 5/02*    (2006.01)
*H05K 5/00*    (2006.01)

(52) U.S. Cl.
CPC ........... *H04R 1/025* (2013.01); *H05K 5/0017* (2013.01); *H05K 5/0217* (2013.01); *H04R 2499/15* (2013.01)

(58) Field of Classification Search
CPC .. H04R 1/025; H04R 2499/15; H05K 5/0217; H05K 5/0017
USPC ........ 381/388, 387, 386, 300, 301, 150, 385
See application file for complete search history.

(56) References Cited

U.S. PATENT DOCUMENTS

| 6,549,263 | B1* | 4/2003 | Kim ................. | G02F 1/133308 349/58 |
| 2008/0010908 | A1* | 1/2008 | Mortier ............... | H05K 5/0226 52/32 |
| 2012/0236482 | A1* | 9/2012 | Lin ...................... | G06F 1/1637 361/679.01 |

FOREIGN PATENT DOCUMENTS

KR    10-2013-0000874 A    1/2013
KR    10-2018-0079875 A    7/2018

\* cited by examiner

*Primary Examiner* — Thjuan K Addy
(74) *Attorney, Agent, or Firm* — Birch, Stewart, Kolasch & Birch, LLP

(57) ABSTRACT

A display apparatus according to the present disclosure can include a display panel; a back frame configured to attach to a wall structure by a fixing element; a height adjustment element joined to the back frame, including a permanent magnet and adjusting a height; a position adjustment element fixed to a rear surface of the display panel, including a magnetic material mounted by a magnetic force of the height adjustment element, and adjusting a position on a plane defined by the height adjustment element; a position limiter engaged between the position adjustment element and the height adjustment element; a sound generating device disposed at a rear surface of the display panel and having a latch holder; a middle frame disposed between the height adjustment element and the position adjustment element, and including a space receiving the sound generating device; and a latch disposed to engage with the latch holder.

16 Claims, 12 Drawing Sheets

DISPLAY APPARATUS

CROSS-REFERENCE TO RELATED APPLICATIONS

This application claims the priority benefit of the Korean Patent Application No. 10-2019-0109887 filed in the Republic of Korea on Sep. 5, 2019, the entire contents of which are hereby expressly incorporated by reference as if fully set forth herein into the present application.

BACKGROUND

Field of the Invention

The present disclosure relates to a display apparatus including a display panel and a tiling coupler (or tiling coupling structure). Especially, the present disclosure relates to a display apparatus including a tiling coupler with which a plurality of display panels having sound generating devices at a rear surface are combined in a matrix manner on the same plane to be expandable without limitation in shape and size.

Discussion of the Related Art

As the information society develops, the demands for display apparatus are also developing in various manners. For example, various flat panel display apparatuses such as a liquid crystal display (or LCD), an organic light emitting display (or OLED), and a micro LED display have been developed.

The flat panel display apparatuses are being developed in various sizes and usages, from small sized electronic devices such as the mobile phones to large sized electronic devices such as outdoor advertising panels. In particular, the demand for a large display apparatus is increasing. For example, it is installed in a stadium and displays information related to the game, and is used for various purposes such as a large billboard displaying and playing a main game scene.

Such a large display apparatus can be manufactured in a size comparable to that of a building's outer wall. However, it is very hard to manufacture an ultra-large flat panel display apparatus using conventional technologies. In order to solve or address this problem, a plurality of display panels can be arranged and assembled in a tiled manner to implement a large display apparatus, rather than manufacturing a large display apparatus with a single panel.

Such a display apparatus is called as a tiling display apparatus. Since the tiled large display apparatus can be manufactured by assembling a plurality of display panels, a seam region which is connecting portions of the display panels, can be recognized when the gaps between the display panels are larger than a certain gap. In addition, as a plurality of display panels can be disposed and combined on the same plane, it can be required that the spacing between panels on the XY plane is minimized, and there is no height difference on the Z axis. In a large display apparatus capable of freely deforming a size by combining a plurality of display panels in a matrix manner, the display panels to be combined are arranged on a plane having the same height, and they can be combined on the same plane without error in the spacing. Consequently, there is a need for new coupling structure to enable this condition easily.

In particular, when the sound generating device is attached to the rear surface of the display panel, a structure of a large display device is required so that the sound generating device can be securely fixed and the display panels can be effectively assembled in a tiling method.

SUMMARY

One purpose of the present disclosure, as for solving or addressing the problems and limitations described above, is to provide a display apparatus formed by assembling a plurality of unit display devices (or unit display panels) in a tiling manner. Another purpose of the present disclosure is to provide a display apparatus having a coupling structure capable of uniformly aligning the heights of the display panels and allowing the seams to be evenly maintained, in the assembling the display apparatus by the tiling method. Still another purpose of the present disclosure is to provide a display apparatus having a coupling structure capable of firmly fixing the sound generating device when assembling the display panels with the sound generating device attached to the rear surface in a tiled manner. Yet another purpose of the present disclosure is to provide a display apparatus including a coupling structure capable of easily performing a process of assembling display apparatus in a tiling manner and selectively disassembling and reassembling a defective display panel as needed.

In order to accomplish the above mentioned purposes of the present disclosure, a display apparatus according to the present disclosure comprises a display panel; a back frame configured to attach to a wall structure by a fixing element; a height adjustment element joined to the back frame, including a permanent magnet and adjusting a height; a position adjustment element fixed to a rear surface of the display panel, including a magnetic material mounted by a magnetic force of the height adjustment element, and adjusting a position on a plane defined by the height adjustment element; a position limiter engaged between the position adjustment element and the height adjustment element; a sound generating device disposed at a rear surface of the display panel and having a latch holder; a middle frame disposed between the height adjustment element and the position adjustment element, and including a space receiving the sound generating device; and a latch disposed at an inner side of the middle frame to engage with the latch holder.

In one example, the latch holder includes a latch hole receiving the latch; and a pedestal contacting a bottom surface of the latch under the latch hole.

In one example, the latch includes a base body fixed at a bottom surface of the inner side of the middle frame; and a clasp extruded from the base body in a horizontal direction.

In one example, the display apparatus further comprises a breaking part formed between the base body and the clasp.

In one example, a distance between the rear surface of the display panel and the inner side of the middle frame corresponds to a height of the sound generating device.

In one example, the latch holder is disposed as being apart from the latch, when the position adjustment element is disposed as being apart from the height adjustment element. The latch holder is engaged with the latch and the sound generating device is fixed to the middle frame, when the display panel is moved to settle the position adjustment element at a correct position on the height adjustment element.

In one example, the display panel and the sound generating device are disassembled from the middle frame as breaking the latch, when separating the display panel from the middle frame in vertical direction.

In one example, the sound generating device includes a guide protrusion disposed around the latch holder, and the latch further includes a rail member receiving the guide protrusion, the guide protrusion moving within the rail member.

In one example, the latch holder is disposed as being apart from the latch, and the guide protrusion is inserted into one end of the rail member, when the position adjustment element is disposed as being apart from the height adjustment element. The latch holder is engaged with the latch and the sound generating device is fixed to the middle frame, and the guide protrusion is moved to another end of the rail member, when the display panel is moved to settle the position adjustment element at a correct position on the height adjustment element.

In one example, the position adjustment element includes an attaching surface fixed to the display panel; a position adjusting surface protruded from the attaching surface toward the height adjustment element; a position limiting hole formed at the position adjusting surface; and an adjusting chamber formed between the attaching surface and the position adjusting surface. The position limiter includes a head mounted in the adjusting chamber; an extrusion protruded from a center portion of a bottom surface of the head; and a cushion attached on an upper surface of the head. The position limiting hole has a diameter that is smaller than the head and larger than the extrusion. The extrusion is configured to penetrate the position limiting hole and to insert into the base hole.

In one example, the position adjusting hole includes an oval shape having a major axis and a minor axis. The minor axis has a minor length that is the same as a diameter of the extrusion. The major axis has a major length larger than the diameter of the extrusion, and is disposed at a diagonal direction on a surface of the display panel.

In one example, the latch holder is disposed as being apart from the latch, when the extrusion is inserted into the base hole, and the position limiting hole is located at one end with respect to the extrusion. The latch holder is engaged with the latch and the sound generating device is fixed to the middle frame, when the position limiting hole is moved to another end with respect to the extrusion to settle the position adjustment element at a correct position on the height adjustment element.

In one example, the display apparatus further comprises an adhesive layer disposed between an upper surface of the sound generating device and the rear surface of the display panel to attach the sound generating device to the display panel.

In one example, the height adjustment element has a cylindrical body having a neodymium magnetic material.

The display apparatus according to the present disclosure has a structure in which a plurality of display panels can be assembled by a tiling method using a back frame. In detail, a height adjustment element made of a permanent magnet is installed on the back frame, and a position adjustment element made of a magnetic material is installed on the display panel. The position adjustment element is attached by the magnetic force of the height adjustment element, and an external force can be used to adjust the position on a plane. Further, the height of the display panel can be adjusted by using the height adjustment element. Accordingly, the position on the XY plane and the height on the Z axis can be adjusted respectively, so that it is possible to provide a large-sized display apparatus that is combined without gaps of seams on the same plane. In addition, the coupling force tiling a plurality of display panels uses the magnetic force, so it has an advantage of easy assembly and disassembly. According to the present disclosure, after assembling a large-sized display apparatus of a tiling method, even though a problem occurs in any one display panel, it is possible to selectively disassemble it and to reassemble with a new normal display panel very easily. According to the present disclosure, in assembling the display panels with the sound generating device attached to the rear surface, in a tiling method, the sound generating device can be fixed securely.

In addition to the effects of the present disclosure mentioned above, other features and advantages of the present disclosure can be described below, or can be clearly understood by those skilled persons in this art from such below descriptions and explanations.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
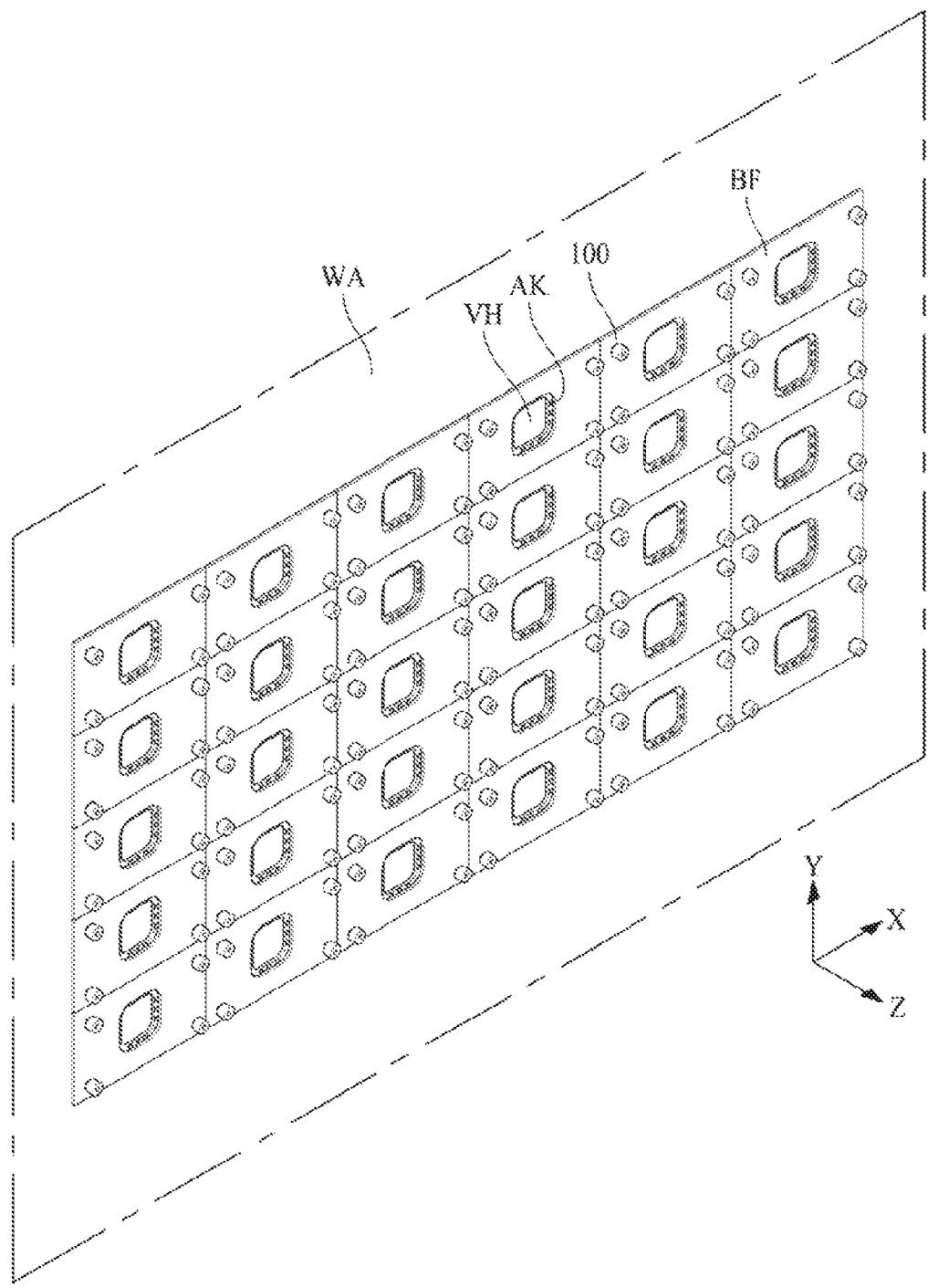
FIG. 1 is a perspective view illustrating the overall appearance of a back frame in a tiled display apparatus according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part can also be present unless "only" is used. The terms in a singular form can include plural forms unless noted to the contrary.

In construing an element, the element is construed as including an error range although there is no explicit description.

In describing a positional relationship, for example, when the positional order is described as "on," "above," "below," and "next," the case of no contact there-between can be included, unless "just" or "direct" is used. If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms and do not define any order. These terms are only used to distinguish one element from another. For example, a first element could be termed a second element, and, similarly, a second element could be termed a first element, without departing from the scope of the present disclosure.

Further, "X axis direction", "Y axis direction" and "Z axis direction" may not be interpreted only as a geometric relationship in which the relationship between each other is perpendicular, and can mean that the configuration of the present disclosure has a wider scope to the extent that it can functionally work.

In describing the elements of the present disclosure, terms such as the first, the second, A, B, (a) and (b) can be used. These terms are only to distinguish the elements from other elements, and the terns are not limited in nature, order, sequence or number of the elements. When an element is described as being "linked", "coupled" or "connected" to another element that element can be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

The 'display apparatus' in this application can comprise a liquid crystal module (LCM), an organic light emitting display module (OLED Module), or a quantum dot module (QD Module) which are have a display panel and a driver for driving the display panel. The 'display apparatus' can further comprise a complete product or final product including LCM, OLED Module or QD Module such as a note-book computer, a television set, a computer monitor, an equipment apparatus having an automotive apparatus or other modules for vehicle, a set electronic apparatus or a set device (or set apparatus) such as a smart phone or a mobile electronic apparatus.

Therefore, the 'display apparatus' can be any one of a display device such as LCM, OLED Module and QD Module, an application device including LCM, OLED Module or QD Module, or a set apparatus for end user's final devices.

In another example, the LCM, OLED Module or QD Module can be referred to the 'display apparatus', and the final electronic devices including LCM, OLED Module or QD Module can be referred to the 'set apparatus'. For example, the display apparatus can include a display panel of liquid crystal display or organic electroluminescence display, and a source printed circuit board (PCB) for driving the display panel. The set apparatus can include the display apparatus and a set PCB or control PCB for driving the set apparatus itself by connecting to the display apparatus and the source PCB.

The display panel according to the embodiments of the present disclosure can include a liquid crystal display panel, an organic light emitting diode display panel, and an electroluminescent display panel, but it is not limited thereto. For example, display panel can have any structure in which the display panel can be vibrated to generate sound. In addition, the display panel applied to the display apparatus according to the embodiment of the present disclosure is not limited to the shape or size of the display panel.

In the case that the display panel is the liquid crystal display panel, the display panel can include a plurality of gate lines, a plurality of data lines, and a plurality of pixels (or sub pixels) defined by the gate lines and the data lines. The display panel can include an array substrate including thin film transistor as a switching element for controlling the light transmittance of each pixel, an upper substrate including a color filter and/or a black matrix, and a liquid crystal layer disposed between the array substrate and the upper substrate.

In the case that the display panel is an organic light emitting diode display panel, the display panel can include a plurality of gate lines, a plurality of data lines, and a plurality of pixels (or sub pixels) defined by the gate lines and the data lines. The display panel can include an array substrate including thin film transistor for applying the electric voltage to each pixel selectively, an organic light emitting layer on the array substrate, and an encapsulation substrate disposed on the array substrate for covering the organic light emitting layer. The encapsulation substrate can protect the thin film transistor and the organic light emitting layer from any external shocks, and prevent moisture and oxygen from penetrating into the organic light emitting layer. In addition, the organic light emitting layer formed on the array substrate can be replaced by the inorganic light emitting layer, the quantum dot light emitting layer, or the micro light emitting diode element.

Hereinafter, an example of a display apparatus according to the present disclosure will be described in detail with reference to the accompanying drawings. In designating reference numerals to elements of each drawing, the same components can have the same reference numerals as much as possible even though they are shown in different drawings. Scale of the elements shown in the accompanying drawings have a different scale from the actual for convenience of description, it is not limited to the scale shown in the drawings.

Figure 2:
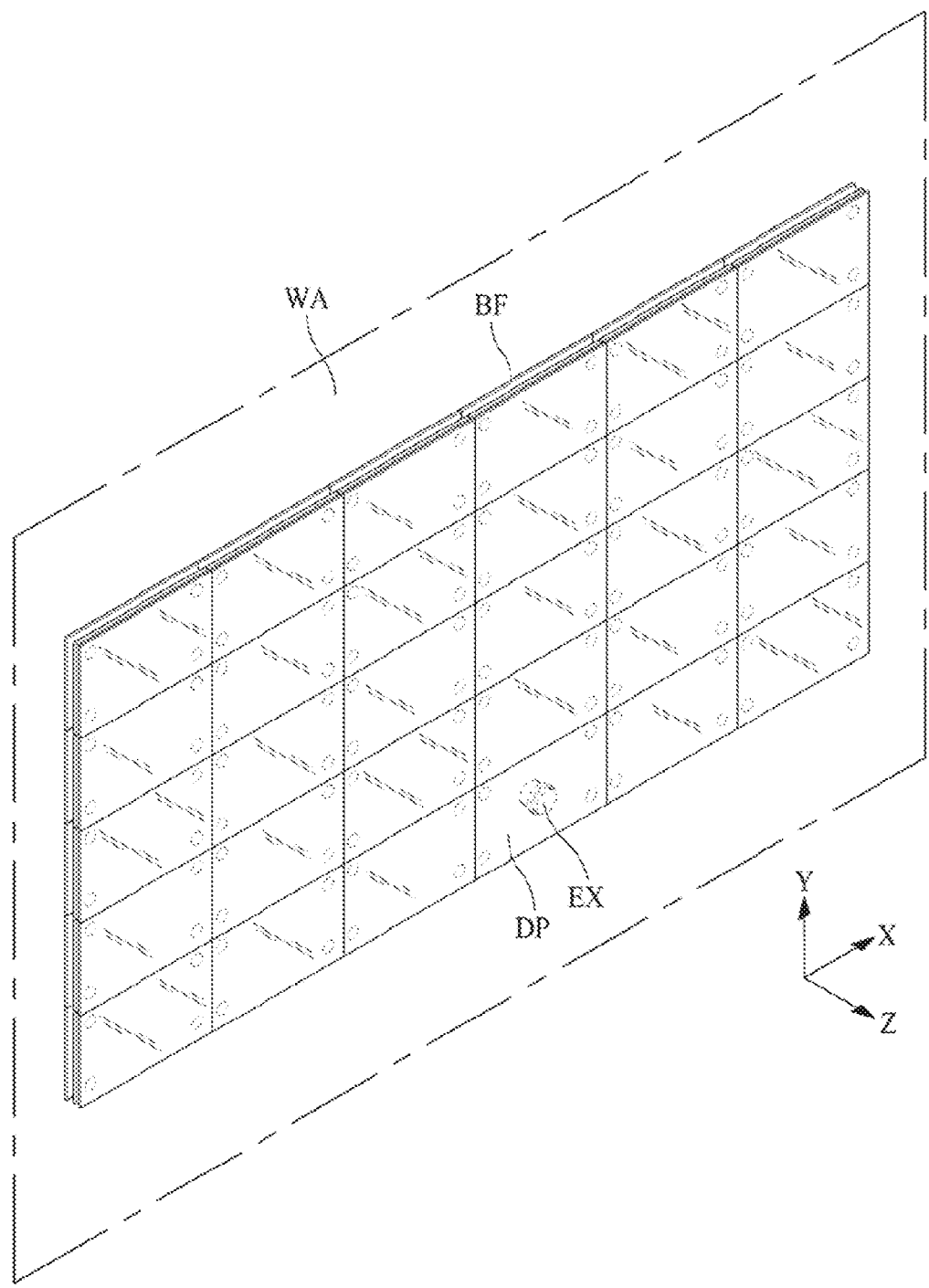
FIG. 2 is a perspective view illustrating the overall appearance of a display apparatus assembled by a tiling method according to the present disclosure.

Referring to FIGS. 1 and 2, a display apparatus assembled by the tiling method according to the present disclosure will be explained. FIG. 1 is a perspective view illustrating the overall appearance of a back frame in a tiled a display apparatus according to the present disclosure. FIG. 2 is a perspective view illustrating the overall appearance of a display apparatus assembled by a tiling method according to the present disclosure. All the components of the display apparatus according to all embodiments of the present disclosure are operatively coupled and configured.

Here, an example will be explained in which a large display apparatus can be installed on an exterior wall of a building, a large interior wall of the lobby, or a large wall specially provided for information. However, it is not limited to this, and it can be applied to a movable frame not a fixed wall. The coordinate systems shown in FIGS. 1 and 2 are added for convenience of explanation. For example, display apparatus can be arranged on a wall of XY plane, and video information can be provided from the display apparatus in the +Z direction. The viewer can view the video image provided by the display apparatus by looking at the XY plane in the Z direction.

As shown in FIG. 1, a plurality of back frames BF can be disposed in a matrix manner on a wall structure WA. FIG. 1 illustrates a structure in which 30 back frames are tiled with six back frames in the lateral direction and five frames in the portrait direction. It is not limited thereto, and it is possible to from a back frame assembly of a desired size with more or less numbers of the back frame BF. In particular, each of some display panels can include a sound generating device, but other display panels may not have the sound generating devices. In other cases, each of all display panels can include sound generating device, respectively. Otherwise, any display panel may not include the sound generating device at all. Hereinafter, the explanation is focused on the case that the display panel has the sound generating device.

The back frame BF can be a structure that is a basic frame for arranging a plurality of display panels in a tiling method. For example, one back frame BF can have a size and shape to accommodate one display panel. The back frame BF can be provided with a height adjustment element 100 capable of coupling the display panel. The back frame BF can further include a vent hole VH for dissipating the heat generated from the display panel.

The back frame BF can be fixed and arrayed on the wall structure WA by a plurality of fixing member AK. The fixing member AK can be a fastening member for firmly fixing the frame on to the wall structure, such as an anchor, a screw or a concrete nail. FIG. 1 can illustrate a structure in which the fixing member AK can be fixed to the wall structure WALL via a fixing hole provided around the vent hole VH formed in the central portion of the back frame BF. However, it is not limited thereto, but it can be changed in various ways depending on the overall design structure.

One back frame BF can include a height adjustment element 100. It is preferable that a plurality of the height adjustment element 100 can be disposed at one back frame BF. FIG. 1 illustrates 4 height adjustment elements 100 are disposed at each corner portions of each back frame BF, but it is not limited thereto. In one example, one or two height adjustment elements 100 can be further disposed at a central portion of the back frame BF. In another example, 4 more height adjustment elements 100 can be disposed at each middle portion of the 4 sides.

Referring to FIG. 2, one display panel DP can be disposed on each back frame BF fixed and arrayed on the wall structure WA in a matrix manner. Some of the display panels DP can include a sound generating device EX, respectively. Other display panels DP may not have the sound generating device.

The display panel DP can be mounted on the height adjustment element 100 of the back frame BF, and the disposed height of the display panel DP can be controlled by the height adjustment element 100. Accordingly, the plurality of display panels DP can be implemented a completely flat state by positioning the upper surface on the XY plane at the same height. Here, the height of the display panel DP can be adjusted on the Z axis.

Hereinafter, various tiling coupler for coupling and fixing the display panels DP to the back frame BF according to one or more embodiments of the present disclosure will be explained in detail with reference to the drawings.

First Embodiment

Figure 3:
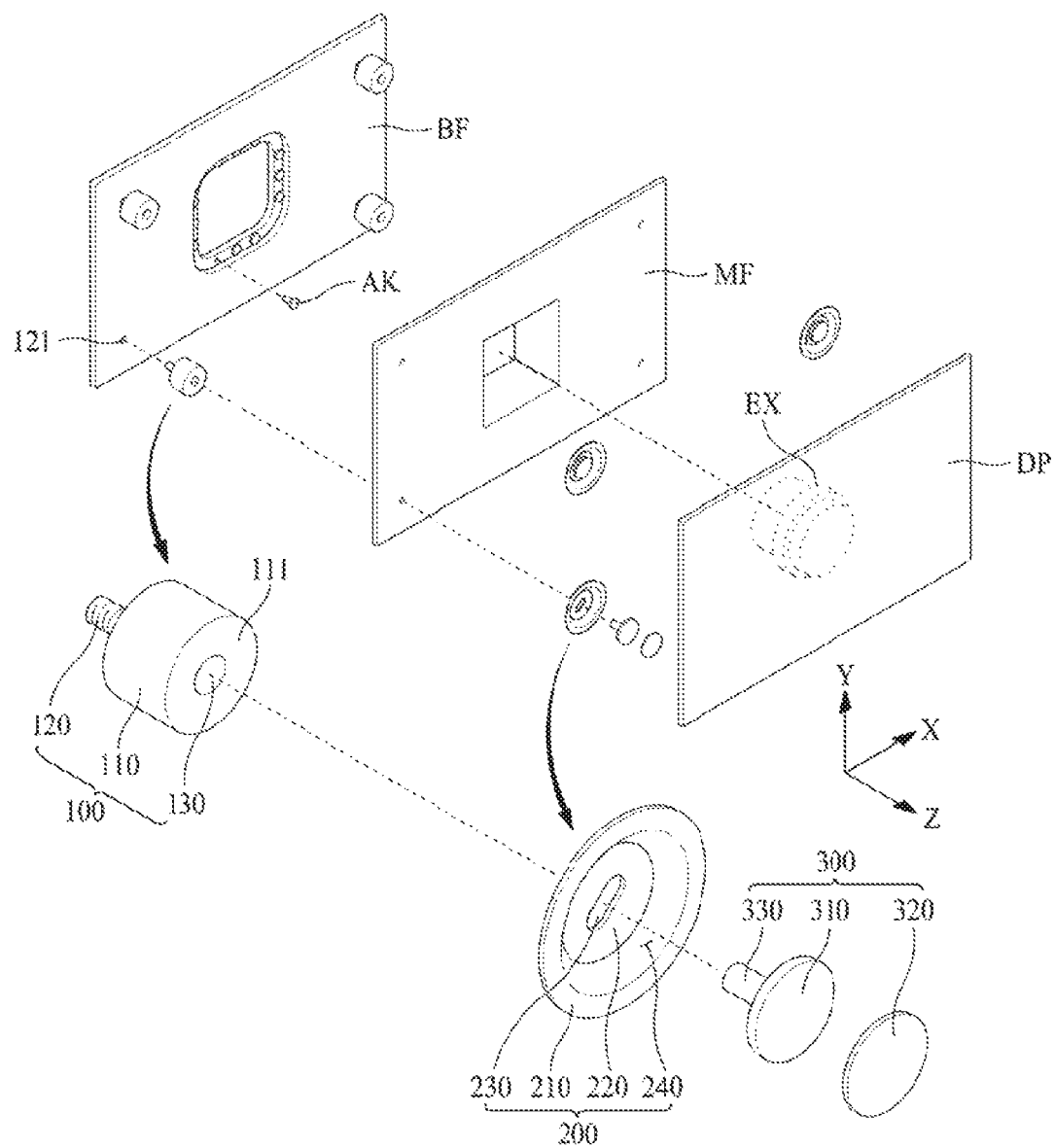
FIG. 3 is a perspective view illustrating a display apparatus including a tiling coupler according to a first embodiment of the present disclosure.
Figure 4:
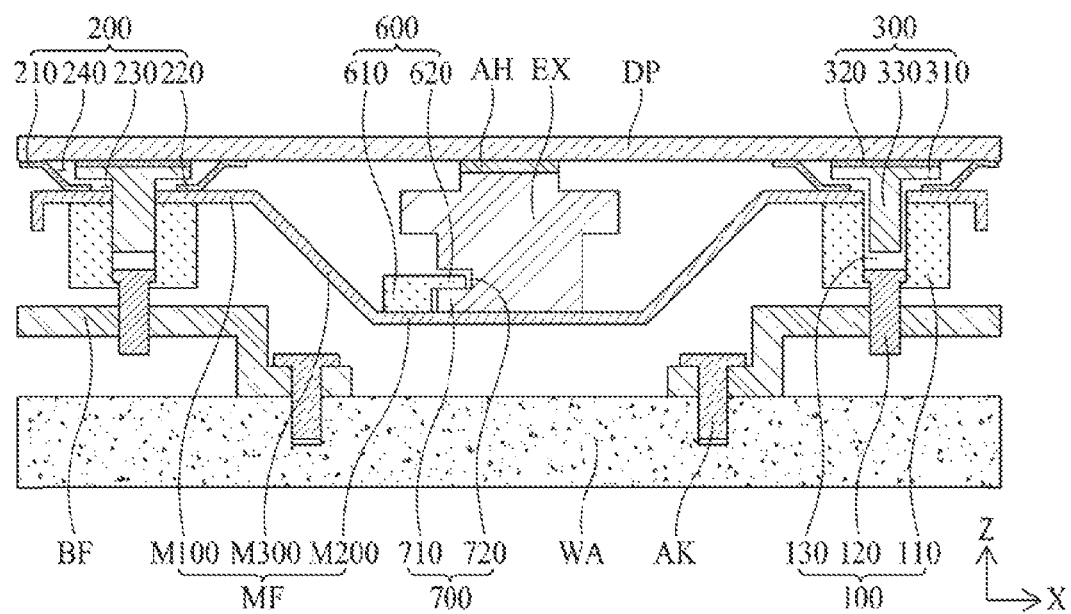
FIG. 4 is a cross-sectional view illustrating a structure of the display apparatus assembled by the tiling coupler according to the first embodiment of the present disclosure shown in FIG. 3.

Further referring to FIGS. 3 and 4, a first embodiment of the present disclosure will be explained. FIG. 3 is a perspective view illustrating a display apparatus including a tiling coupler according to the first embodiment of the present disclosure. FIG. 4 is a cross-sectional view illustrating a structure of the display apparatus assembled by the tiling coupler according to the first embodiment of the present disclosure shown in FIG. 3.

The display apparatus according to the first embodiment of the present disclosure can comprise a back frame BF, a display panel DP, a height adjustment element 100, a position adjustment element 200, a position limiter 300 and a middle frame MF. The back frame BF can be attached and/or fixed onto the wall structure WA using a fixing member AK. The display panel DP can be arranged as corresponding to the back frame BF. The display panel DP can include a liquid crystal display panel, an electroluminescent display panel, a quantum dot display panel and/or other flat display panel.

The sound generating device EX can be attached at the middle portion of the rear surface of the display panel DP. The display panel DP can generates the sounds when the display panel DP is vibrated by the sound generating device EX. Most sounds generated from the vibration of the display panel DP can be directly output to the +Z direction which is the front direction of the display panel. As the sound is generated from the display panel DP, the immersion of the viewer can be enhanced.

The height adjustment element 100 can be a structure mounted into the back frame BF and capable of its height. In particular, the height adjustment element 100 can be made of a permanent magnet material. For example, it is preferable that the height adjustment element 100 can be made of a neodymium magnet. Neodymium magnets can be made of neodymium, iron and boron, and can be processed into various shapes. There can be a property having a large magnetic force even in a small volume, it can be applied to various fields.

The height adjustment element 100 can include a cylindrical mount 110 and a screw portion 120. The mount 110 and the screw portion 120 can be formed of a united body, or formed as separated objects and then combined. For example, the screw portion 120 can have a smaller diameter than the mount 110 and can have a structure protruding from the center of the lower surface of the mount 110. In another example, after forming the screw portion 120 and the mount 110 in a long cylindrical shape with a neodymium magnet, a thread is formed in a lower portion to define the screw portion 120, and the upper portion can be defined as the mount 110.

The screw portion 120 can be inserted into and coupled to a screw hole 121 provided at the back frame BF as the threads of the screw portion 120 are interlocks with the threads of the screw hole 121. The height of the mount 110 can be controlled by rotating the screw portion 120. The mount 110 can be disposed on the screw portion 120 and facing with the position adjustment element 200. In particular, the mount 110 can include a flat mount surface 111 having a predetermined area.

In one example, the screw portion 120 can be a right-handed screw. In this case, as rotating to right-hand direction, the screw portion 120 can be gradually inserted into the screw hole 121. As rotating to left-hand direction, the screw portion 120 can be gradually come out of the screw hole 121. For example, as rotating to right-hand direction, the mount 110 can move to −Z direction, while as rotating to left-hand direction, the mount 110 can move to +Z direction. Accordingly, due to the rotation of the screw portion 120, the height on the Z axis of the mount surface 111 of the mount 110 can be controlled.

A base hole can be formed in the center portion of the mount surface 111. The base whole 130 can be a portion in which a central portion of the mount surface 111 is recessed into the mount 110 with a predetermined depth. Therefore, the mount surface 111 can be a surface surrounding the rim area (or the circumference area) at the top surface of the mount 110.

The position adjustment element 200 can be attached or fixed to a rear surface of the display panel DP. It is preferable that each one of the position adjustment element 200 can be fixed on the rear surface of the display panel DP as corresponding to each one of the height adjustment element 100. Moreover, it is preferable that the position adjustment element 200 can be formed of a magnetic material that can be attached by the magnetic force of the permanent magnet. When a magnetic material is placed in a magnetic field, it is magnetized and generates a magnetic force. In the interim, it is preferable that the position adjustment element 200 can be formed of a soft magnetic material of which magnetic force is disappeared when the magnetic field is lost.

For example, as the height adjustment element 100 can be a permanent magnet, the height adjustment element 100 can be made of a hard magnetic material such as alnico. The position adjustment element 200 can be made of soft magnetic material which is magnetized and seated on the height adjustment element 200 when it is within the magnetic force range of the height adjustment element 100. When the position adjustment element 200 is out of the magnetic force range of the height adjustment element 100, the magnetization is removed.

The position adjustment element 200 can include an attaching surface 210, a position adjusting surface 220 and a position adjusting hole 230. The attaching surface 210 can be a portion for attaching or fixing on the rear surface of the display panel DP. In FIG. 3, the position adjustment element 200 has a disc shape, and the attaching surface 210 has a circular band shape corresponding to the edge frame area. However, it is not restricted thereto, but it can have various shapes.

The position adjusting surface 220 can be a protruded portion from the attaching surface 210 toward the height adjustment element 100. For example, the position adjusting surface 220 can be a recessed portion from the attaching surface 210.

The position adjusting hole 230 can be a through hole formed at the middle of the position adjusting surface 220. The position adjusting hole 230 can have an oval shape including a major axis larger than the base hole 130 formed at the height adjustment element 100 and a minor axis same with the base hole 130.

As there is height difference between the attaching surface 210 and the position adjusting surface 220, there can be an empty space there-between. The position limiter 300 can be disposed within this space, and this space can be referred to an adjusting chamber 240.

The position limiter 300 can have a "T-shape" structure in which some of the position limiter 300 are mounted into the adjusting chamber 240 of the position adjustment element 200 and others of the position limiter 300 are extruded through the position adjusting hole 230.

For example, the position limiter 300 can include a head 310, an extrusion 330 and a cushion 320. The head 310 can be a portion settling into the adjusting chamber 240. In detail, the head 310 can have a disc shape. It is preferable that the head 310 can be larger than the diameter of the position limiting hole 230 so that the head 310 can be limitedly arranged inside the adjusting chamber 240.

The extrusion 330 can be a portion protruding toward the height adjustment element 100 from the center of the bottom surface of the head 310. It is preferable that the extrusion 330 can be inserted into the base hole 130 of the height adjustment element 100. For example, the extrusion 330 can have a cylindrical shape having a diameter little smaller than the diameter of the base hole 130 and a length little shorter than the depth of the base hole 130. The extrusion 330 can be inserted into the base hole 130 through the position limiting hole 230 starting from the head 310 located in the inner space of the adjusting chamber 240.

The upper surface of the head 310 can be a surface in close contact with the rear surface of the display panel DP. When moving on the XY plane to adjust the position of the display panel DP, a friction force can occur between the head 310 and the rear surface of the display panel DP. The rear surface of the display panel DP can be damaged by this friction force. To prevent this problem, the cushion 320 can be adhered to the upper surface of the head 310.

The sum of the height of the head 310 and the cushion 320 can be equal to or slightly lower than the height of the adjusting chamber 240. For example, the sum of the heights of the head 310 and the cushion 320 can be equal to or slightly smaller than the height difference between the attaching surface 210 and the position adjusting surface 220 of the position adjustment element 200.

The position adjusting hole 230 can have an oval (or ellipse) shape. For example, the position adjusting hole 230 can have a major axis and a minor axis. The minor axis of the position adjusting hole 230 can be equal to or slightly larger than the diameter of the extrusion 330. The major axis of the position adjusting hole 230 can have a length and direction for limiting the range of movement of the position adjusting surface 220. In one example, the major axis of the position adjusting hole 230 can be arranged diagonally in the direction of 45°-225° on the XY plane. In addition, it is preferable that the major axis is larger than the minor axis. Even though the major axis is larger than the diameter of the head 310, as the minor axis is smaller than the head 310, the head 310 may not come out from the adjusting chamber 240. In one example, the major axis can have a value between 1.5 times and 2.5 times the minor axis.

The screw portion 120 of the height adjustment element 100 can be coupled to the screw hole 121 of the back frame BF. The position adjustment element 200 can include the position limiter 300, and can be fixed on the rear surface of the display panel DP. Here, the head 310 of the position limiter 300 can be located inside the adjusting chamber 240 of the position adjustment element 200, and the extrusion 330 can be protruded as penetrating the position limiting hole 230 of the position adjustment element 200.

When the display panel DP having the position limiter 300 and the position adjustment element 200 is combined with the back frame BF having the height adjustment element 100, the extrusion 330 of the position limiter 300 can be assembled while being inserted into the base hole 130 of the height adjustment element 100.

As the minor axis of the position adjusting hole 230 is equal to or slightly larger than the extrusion 330 and the base hole 130, the position adjustment element 200 can be tightly joined with the extrusion 330 in the minor axis direction. However, as the major axis of the position adjusting hole 230 is larger than the extrusion 330 and the base hole 130, the extrusion 330 can be adjusted its position along the major axis direction of the position adjusting hole 230. For example, the position adjusting surface 220 of the position adjustment element 200 can be settled on the mount surface 111 of the height adjustment element 100, and the position of the position adjustment element 200 can be adjusted its position along the diagonal direction on the XY plane. Here, the position adjustment can be limited within the range of gap between the major axis of position adjusting hole 230 and the extrusion 330.

The middle frame MF can be disposed between the height adjustment element 100 and the position adjustment element 200. The middle frame MF can be an element for installing a devices additionally installed at the rear surface of the display panel DP. For example, as shown in FIG. 4, the middle frame MF can have a vessel shape for configuring to mount the sound generator EX on the rear surface of the display panel DP.

In one example, the middle frame MF can include a base surface M100, a mounting surface M200 and a link surface M300. The base surface M100 can be disposed between the position adjustment element 200 and the height adjustment element 100. The mounting surface M200 can be a protruded portion from the base surface M100 toward the back frame BF, and can have a predetermined size suitable for mounting a various devices. The link surface M300 can be a portion connecting the base surface M100 and the mounting surface M200 that can have a gentle bevel (or slanted plane) shape.

It is preferable that the space between the mounting surface M200 and the rear surface of the display panel DP can have a volume suitable for the devices mounting therein. For example, when the sound generating device EX can be disposed as attaching to the rear surface of the display panel DP, the space between the mounting surface M200 and the rear surface of the display panel DP can be corresponding to the height of the sound generating device EX.

In the case that a vibrating device such as the sound generating device EX is attached to the rear surface of the display panel DP, the sound generating device EX can need to be securely fixed. To do so, a latch 600 can be installed at the middle frame MF.

In addition, the sound generating device EX can include a latch holder 700 for fastening the latch 600. In the process of coupling the display panel DP to the middle frame MF, the latch 600 can be engaged with the latch holder 700 to securely fix the sound generating device EX.

When combining a plurality of display panels DP in tiling method, the position on the XY plane and the height on the Z axis can be respectively controlled or adjusted. Therefore, it is possible to provide a large-sized display apparatus that is combined without gaps of seams on the same plane.

Since the coupling force for tiling the plurality of display panels DP uses the magnetic force, there can be an advantage of easy assembly and disassembly. After assembling a large-sized display apparatus of a tiling method, when a problem occurs in any display panel DP, it is possible to selectively separate it and reassemble a new normal display panel DP.

Hereinafter, referring to FIG. 4, the detailed structures of the latch holder 700 and the latch 600 disposed at the back frame BF and the connection structure of them will be explained. The back frame BF can be fixed on the wall WA by the fixing member AK. The back frame BF can have a curved structure in which the middle portion is in close contact with the wall WA and the edges are spaced apart from the wall WA by a certain height. At the side portions of the back frame BF, where it is bended as being apart from the wall WA, the height adjustment element 100 can be inserted.

The height adjustment element 100 can include a (cylindrical) mount 110, a screw portion 120 and a base hole 130. The screw portion 120 can be inserted into the back frame BF and fixed as having a predetermined height. As rotating the screw portion 120, the height of the mount 110 can be controlled.

The middle frame MF can be disposed on the top portion of the height adjustment element 100. In particular, it is preferable that the middle frame MF can have a plurality of holes corresponding to the base hole 130 formed at the height adjustment element 100.

The display panel DP can be settled on the middle frame MF. The position adjustment element 200 and the sound generating device EX can be attached at the rear surface of the display panel DP. The position adjustment element 200 can be fixed and attached at the place corresponding to the height adjustment element 100. The sound generating device EX can be attached at the middle portion of the rear surface of the display panel DP. For example, using an adhesive material AH such as a double side adhesive tape or an epoxy adhesive, the sound generating device EX can be attached to the display panel DP.

The latch 600 can be disposed at the middle portion of the inner surface of the middle frame MF. The latch 600 can include a base body 610 and a clasp 620. The base body 610 can be a part for fixing on the inner surface of the middle frame MF, i.e., on the surface of the mounting surface M200. Using a coupling member such as a screw, the base body 610 can be fixed on the mounting surface M200 of the middle frame MF.

The clasp 620 can be apart from the bottom surface of the base body 610 to upward. For example, the clasp 620 can be extruded from the upper portions of the base body 610 in horizontal direction. The space under the clasp 620 is an empty space from the upper surface of the mounting surface M200 to the bottom surface of the clasp 620. This empty space can be used to fix the sound generating device EX.

The sound generating device EX can include the latch holder 700 at the lower portion. The latch holder 700 can include a pedestal 710 and a latch hole 720. The latch hole 720 can be an empty space for receiving a member for fixing the sound generating device EX. The pedestal 710 can be a structure member of the sound generating device EX provided under the latch hole 720. For example, as the clasp 620 of the latch 600 is inserted into the latch hole 720, the pedestal 710 can be fastened with the clasp 620, so that the sound generating device EX can be firmly fixed.

When the display panel DP having the sound generating device EX is assembled with the height adjustment element 100, the sound generating device EX can be fixed as being in closely contact between the display panel DP and the middle frame MF. As the results, as the sound generating device EX is vibrating, the middle frame MF can serve as a strong support base for the sound generating device EX, so that any distortion may not occur in the sound quality generated from the display panel DP. In addition, as the lower structure of the sound generating device EX can be strongly supported by the middle frame MF, it can provide a rich volume of sounds.

Figure 5A:
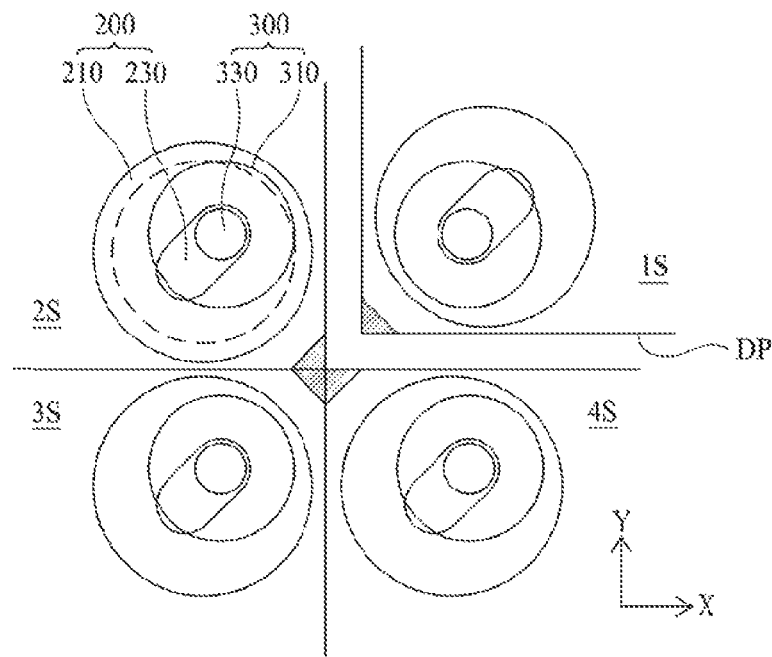
FIGS. 5A and 5B are enlarged plan views illustrating an assembling process of four (4) display panels including a tiling coupler according the first embodiment of the present disclosure.
Figure 5B:
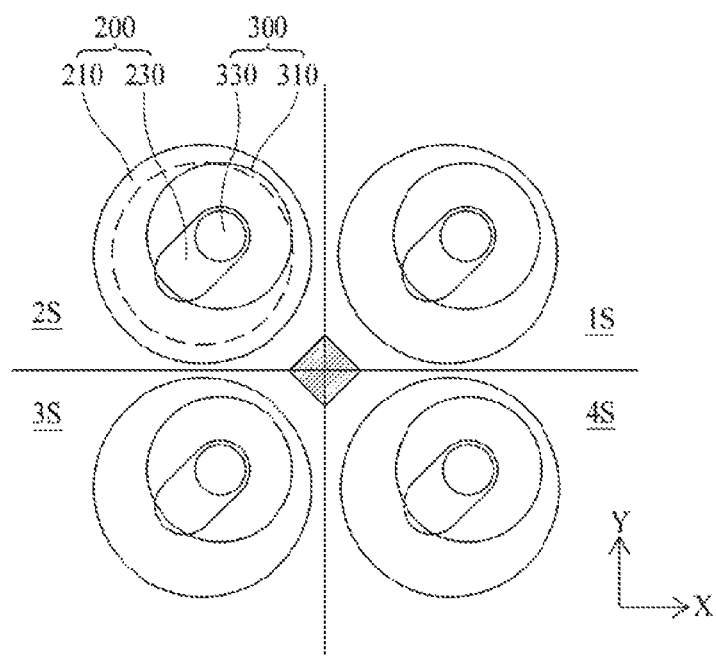

Hereinafter, referring to FIGS. 5A and 5B, the process for assembling the display panels including tiling coupler according to the first embodiment of the present disclosure will be explained. FIGS. 5A and 5B are enlarged plan views illustrating an assembling process of 4 display panels including a tiling coupler according the first embodiment of the present disclosure.

As shown in FIG. 5A, a fourth display panel can be assembled in the first quadrant 1S while three display panels DP can be already assembled in the second quadrant 2S, the third quadrant 3S and the fourth quadrant 4S, respectively. FIG. 5A shows a state in which the extrusion 330 of the position limiter 300 is inserted into the base hole 130. On the XY plane, by combining in the direction biased in the 45 degree direction, it can be assembled with the display panels DP that have been installed without any interference.

After that, the fourth display panel DP can be moved to 225 degree direction on the XY plane. As shown in FIG. 5B, the display panel DP for the first quadrant 1S can be completely assembled with the display panels DP of the second quadrant 2S, the third quadrant 3S and the fourth quadrant 4S.

Controlling the height of the height adjustment element 100, the heights of the display panels DP of the first quadrant 1S to the fourth quadrant 4S can be uniformly matched.

Figure 6A:
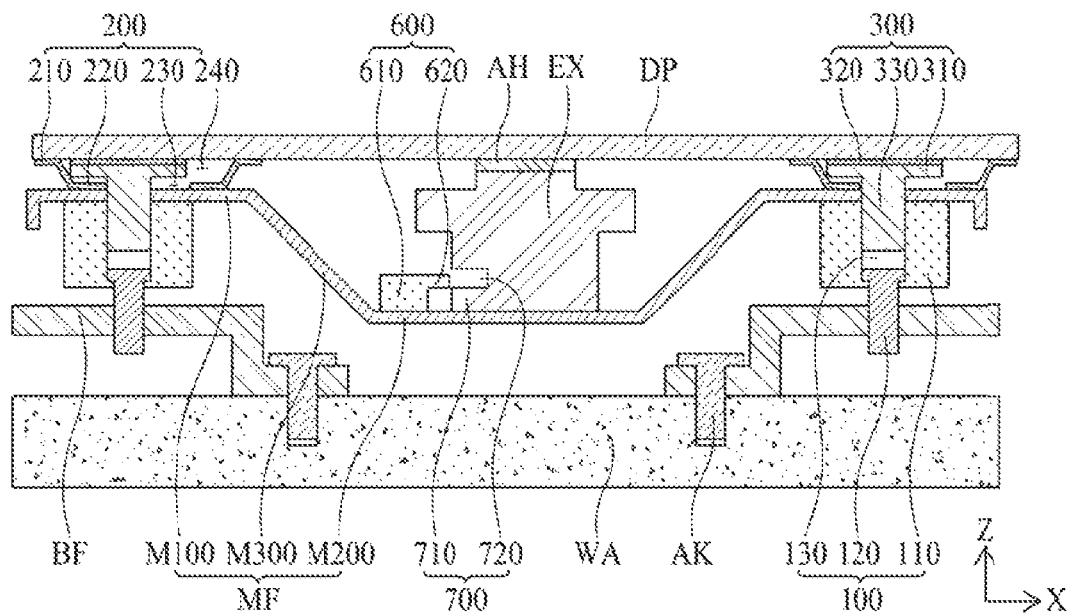
FIGS. 6A to 6C are cross-sectional views illustrating the processes of assembling and disassembling the display panels having the sound generating devices, respectively, using the tiling coupler according to the first embodiment of the present disclosure.
Figure 6B:
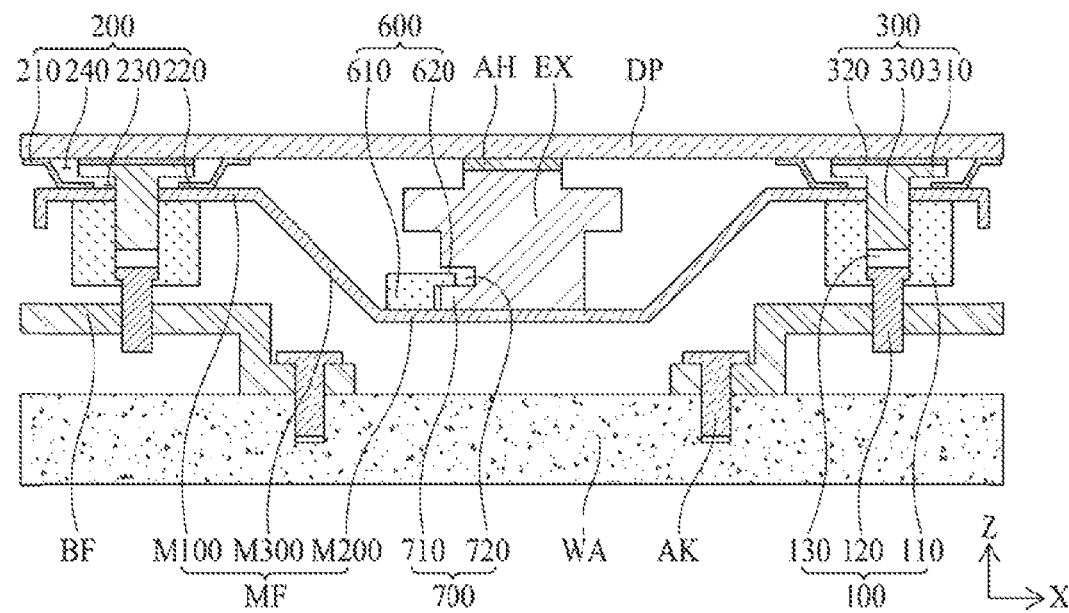

The assembling process for fixing the sound generating device EX to the middle frame during assembling the display panels DP will be explained referring to FIGS. 6A and 6B. FIGS. 6A and 6B are cross-sectional views illustrating the processes of assembling the display panels having the sound generating devices, using the tiling coupler according to the first embodiment of the present disclosure.

The back frame BF can be attached and fixed on the wall structure WA using a fixing member AK. The height adjustment element 100 can be coupled or joined to the back frame BF. For example, 4 height adjustment elements 100 can be coupled to 4 corners of the back frame, respectively. Rotating each of the 4 height adjustment elements 100, the 4 height adjustment elements 100 can be precisely adjusted to a predetermined horizontal height. The middle frame MF can be settled on the 4 height adjustment elements 100. As the middle frame MF is made of a soft magnetic material, the middle frame MF can be settled at a predetermined position on the 4 height adjustment elements 100 made of the permanent magnets.

At the rear surface of the display panel DP, the position adjustment element 200 and the position limiter 300 are attached at four corners, respectively, and the sound generating device EX is attached at the middle portion of the display panel DP. As shown in FIG. 6A, the display panel DP can be located at the assembling start position on the middle frame MF. Here, the assembling start position means a position at which the extrusion 330 of the position limiter 300 is inserted into the base hole 130 of the height adjustment element 100, while the clasp 620 of the latch 600 is apart from the latch hole 720 of the latch holder 700. For example, as shown in FIG. 5A and FIG. 6A, the display panel DP is shifted with maximum distance to the left-upper direction from the final installation position.

After that, as shown in FIGS. 5B and 6B, the display panel DP is moved to the final installation position. Then, the clasp 620 of the latch 600 can be inserted into the latch hole 720 of the latch holder 700, and the pedestal 710 of the latch holder 700 can be inserted into the lower space under the clasp 620. As the result, while the clasp 620 and the pedestal 710 are firmly engaged, the sound generating device EX is securely fixed to the mounting surface M200 of the middle frame MF.

Under this state, when the height of the display panel DP is not adjusted correctly, pushing the display panel DP in the upper left direction, the latch 600 can be disassembled from the latch holder 700, as shown in FIGS. 5A and 6A. After that, the display panel DP can be lifted to a vertical direction to separate it. Rotating the 4 height adjustment elements 100, the heights of the 4 height adjustment elements 100 can be adjusted to form a plane at a predetermined height correctly. After that, as described above, the display panel DP can be re-assembled with the middle frame MF and the back frame BF.

Figure 6C:
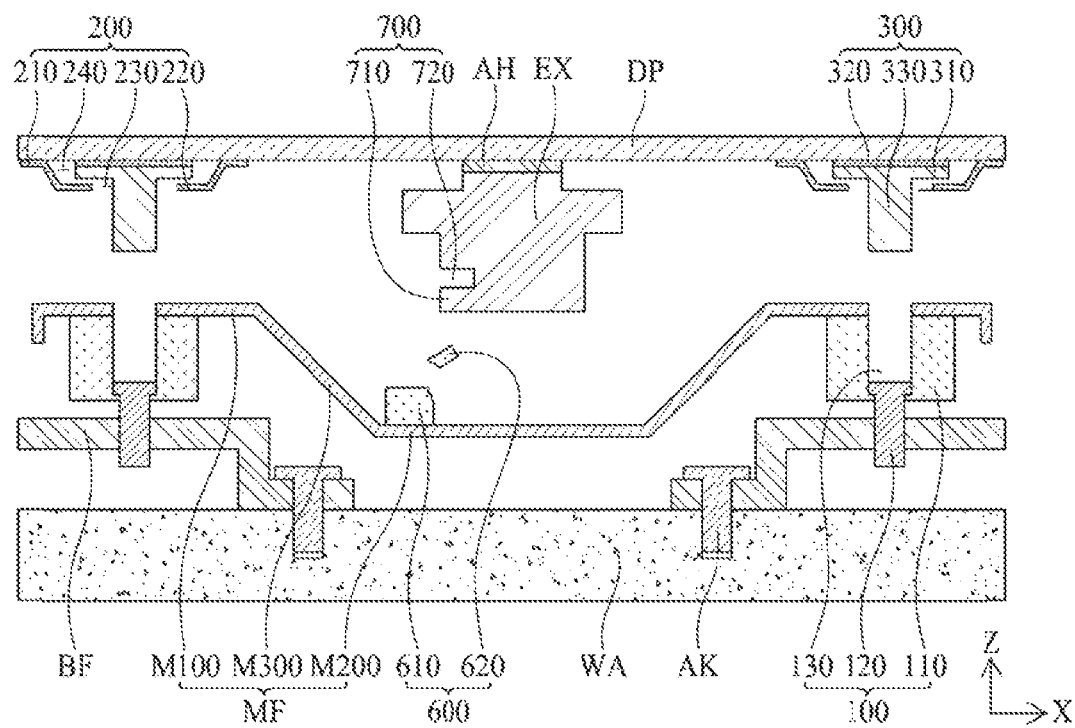

Hereinafter, referring to FIG. 6C, the case in which the specific display panel DP is separated after assembled condition will be described. FIG. 6C is a cross-sectional view illustrating the processes of disassembling the display panels having the sound generating devices, using the tiling coupler according to the first embodiment of the present disclosure.

After assembling a large display device by conducting the assembling process for each display panel DP, a problem can occur in a specific display panel DP, so that it is required to selectively separate only the specific display panel DP. In this case, the specific display panel DP can be disassembled to the vertical direction, i.e., +Z direction, using a vacuum absorber and/or a permanent magnet. In this case, the clasp 620 of the latch 600 fixing the sound generating device EX with the middle frame MF can be broken and the display panel DP can be separated from the middle frame MF.

For the structural features described above, it is preferable that the clasp 620 has sufficient stiffness against the vibration of the EX, but has a fracture resistance that can be easily broken for a predetermined attraction force. Here, the fracture resistance can be a critical resisting force referring to an external force required to break the object. When the fracture resistance is smaller than the vibration force generated from the sound generating device EX in the vertical direction, the sound generating device EX may not be completely fixed. In addition, when the fracture resistance is too large, there can be difficulties as separating the specific display panel DP from the large display apparatus to repair the specific display panel DP.

After repairing the display panel DP having a problem, the display panel DP is re-installed on the middle frame MF. For example, the extrusion 330 of the position limiter 300 disposed on the rear surface of the display panel DP can be inserted into a hole provided at four corners of the middle frame MF. Then, moving the display panel DP, the position of the display panel DP can be adjusted on the middle frame MF. Here, as described above, the latch holder 700 of the sound generating device EX can be assembled with the latch 600 installed on the mounting surface M200 of the middle frame MF. Finally, inserting the middle frame MF and the display panel DP into the back frame BF vertically, the display panel DP can be re-assembled into the large display apparatus.

When combining a plurality of display panels DP in a tiling manner, the position on XY plane and the height on the Z axis are respectively adjusted exactly. Therefore, the present disclosure can provide a large-sized display apparatus coupled without the gaps of the seams on the same plane.

As the coupling force tiling the plurality of the display panels DP uses the magnetic force, there is an advantage of easy assembly and disassembly. In addition, when a problem occurs in any one display panel after assembling the large-sized display apparatus by the tiling method, it is also easy to perform the operation of selectively disassembling the defected display panel and re-assembling with a new normal display panel.

Second Embodiment

Figure 7:
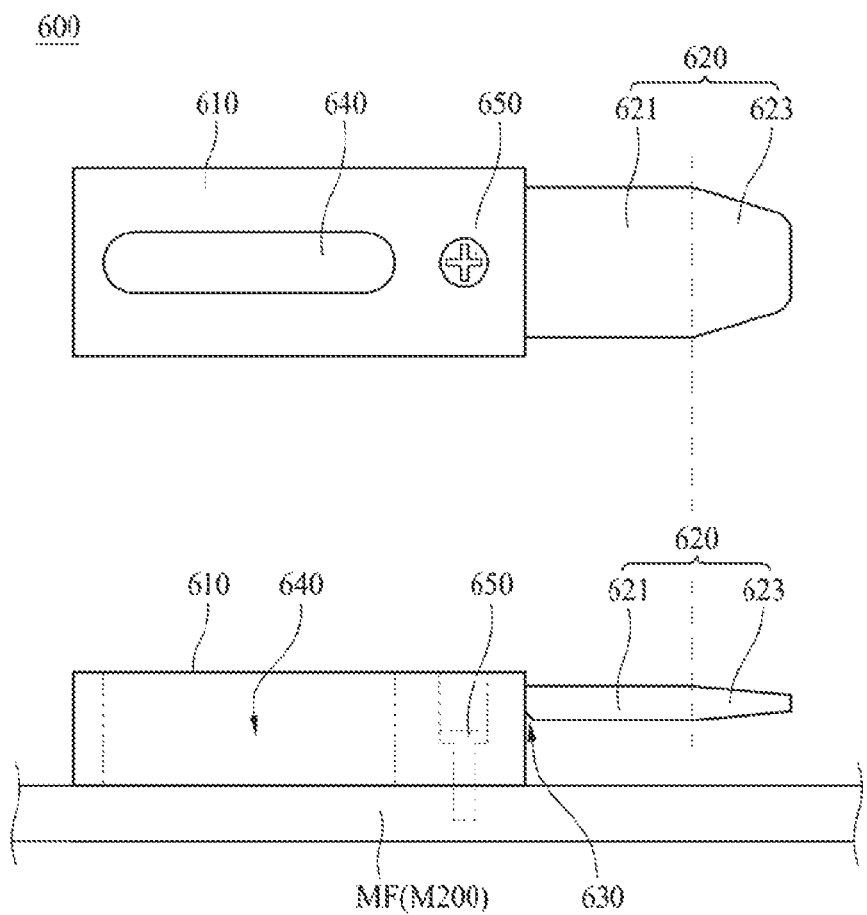
FIG. 7 is a diagram illustrating one example of a latch in the display apparatus having the tiling coupler according to a second embodiment of the present disclosure.

Hereinafter, referring to FIG. 7, the second embodiment of the present disclosure will be described. FIG. 7 is a diagram illustrating one example of a latch in the display apparatus having the tiling coupler according to the second embodiment of the present disclosure. In FIG. 7, the upper drawing is a plane view and the lower drawing is a side view. The structure of the second embodiment of the present disclosure is basically similar with the first embodiment. The difference is on the structure of the latch 600. In addition, due to the structural difference of latch 600, the latch holder 700 can have differences. Therefore, the following description can be focused on the latch 600 and latch holder 700, mainly.

Referring to FIG. 7, the latch 600 according to the second embodiment of the present disclosure can include a base body 610, a clasp 620, a breaking part 630 and a rail member 640.

The base body 610 can be a part for fixing on the inner surface of the middle frame MF, i.e., on the surface of the mounting surface M200. Even though it is not explained in detail, using a coupling member such as a screw 650, the base body 610 can be fixed on the mounting surface M200 of the middle frame MF.

The clasp 620 can be arranged to be spaced a predetermined distance from the bottom surface of the base body 610 to upward. For example, the clasp 620 can be extruded from the upper portions of the base body 610 in horizontal direction. The space under the clasp 620 is an empty space from the upper surface of the mounting surface M200 to the bottom surface of the clasp 620. This empty space can be used to fix the sound generating device EX.

The clasp 620 can include a body 621 and a tip part 623. The body 621 can be a portion connected to the base body 610, and have a first thickness and a first width. The first thickness of the body 621 is preferably to have a thickness that can be inserted into the latch hole 720 of the latch holder 700 formed in the lower portion of the sound generating device EX.

The tip part 623 can be a portion formed at the end of the body 621. The tip part 623 can have a shape that gradually decreases in thickness and width as it moves away from the body 621. The tip part 623 can be a portion formed when the clasp 620 is inserted into the latch hole 720 of the sound generating device EX, so that it can be smoothly guided without being stumbled. Accordingly, it is preferable that the tip part 623 has a length such that the body 621 can be completely inserted into the latch hole 720 of the sound generating device EX. For example, when the tip part 623 is too long, the position of the display panel DP can be set before the body 621 is inserted into the latch hole 720. In this case, the sound generating device EX may not be firmly fixed.

The breaking part 630 can be formed on the connecting portion of the base body 610 and the clasp 620. The breaking part 630 can be a carved wedge portion formed in advance so that the clasp 620 can be accurately broken from the base body 610 by an external force. In one example, the breaking part 630 can have a carved wedge shape with a very narrow width having a thickness thinner that the thickness of the clasp 620. The breaking part 630 can be a part that makes the thickness of the clasp 620 to be thinner than other parts at the connection portion between the clasp 620 and the base body 610. When the breaking part 630 is formed to deep, the clasp 620 can be easily broken. Therefore, it is preferable that the breaking part 630 can have an enough strength that is not easily broken by the vibration force of the sound generating device EX. Further, it is preferable that the breaking part 630 can have the strength of not easily broken even in the process of assembling and disassembling the display panel DP.

It has been described as a case in which only one breaking part 630 is formed at the lower part where the clasp 620 and the base body 610 meet. However, it is not restricted thereto, and an additional breaking part 630 can be further formed at the upper portion where the clasp 620 and the base body 610 meet. In addition, although the breaking part 630 is not described in the first embodiment, the breaking part 630 can be further provided in the first embodiment.

The rail member 640 can be an induction rail for guiding the latch holder 700 of the sound generating device EX to move in a straight line on a path inserted into the latch 600, in the process of assembling the display panel DP with the middle frame MF. Since the rail member 640 can be a member for controlling the movement of the sound generating device EX, a guide protrusion GU can be further included in the vicinity of the latch holder 700 at the lower part of the sound generating device EX. The structure in which the rail member 640 and the latch holder 700 are combined will be described in detail below.

Figure 8A:
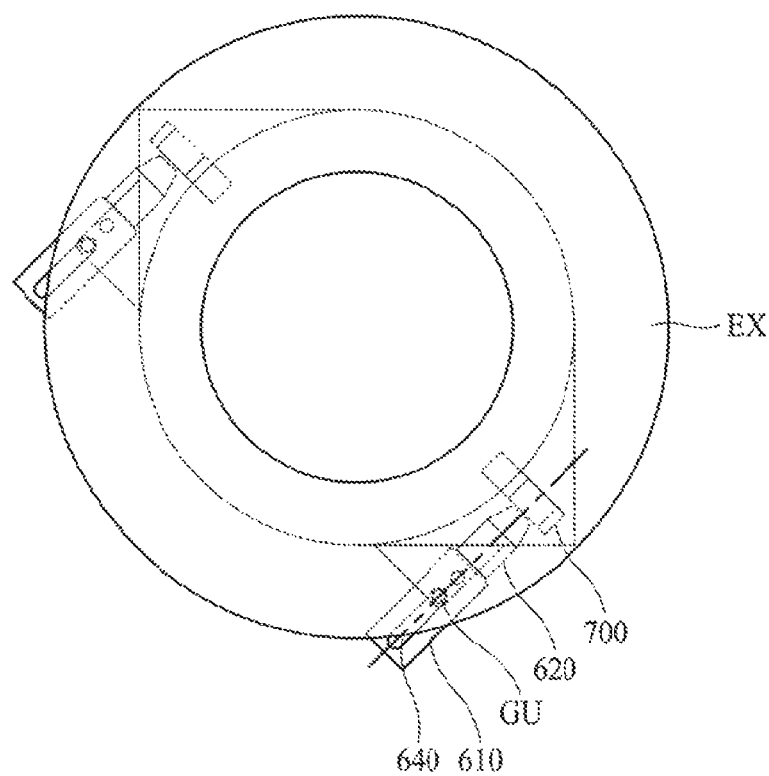
FIGS. 8A to 8C are diagrams illustrating a structure of the sound generating device at starting of the assembling process, in the display panel having the tiling coupler according to the second embodiment of the present disclosure.
Figure 8B:
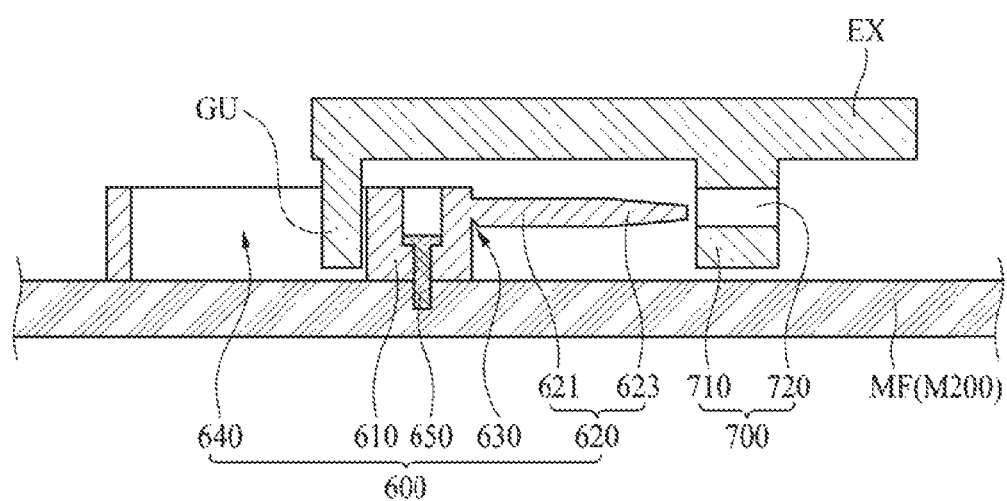
Figure 8C:
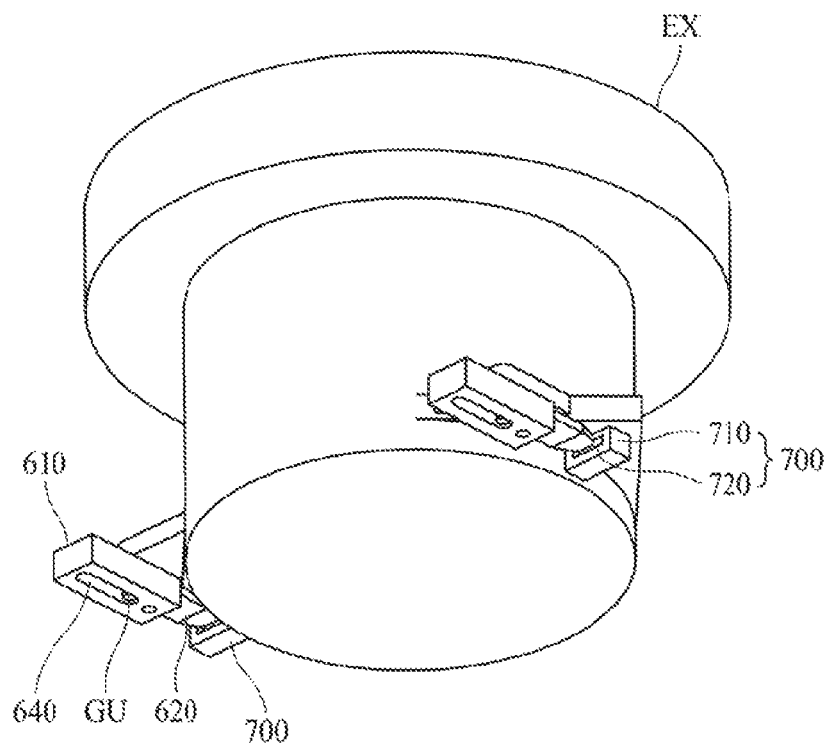
Figure 9A:
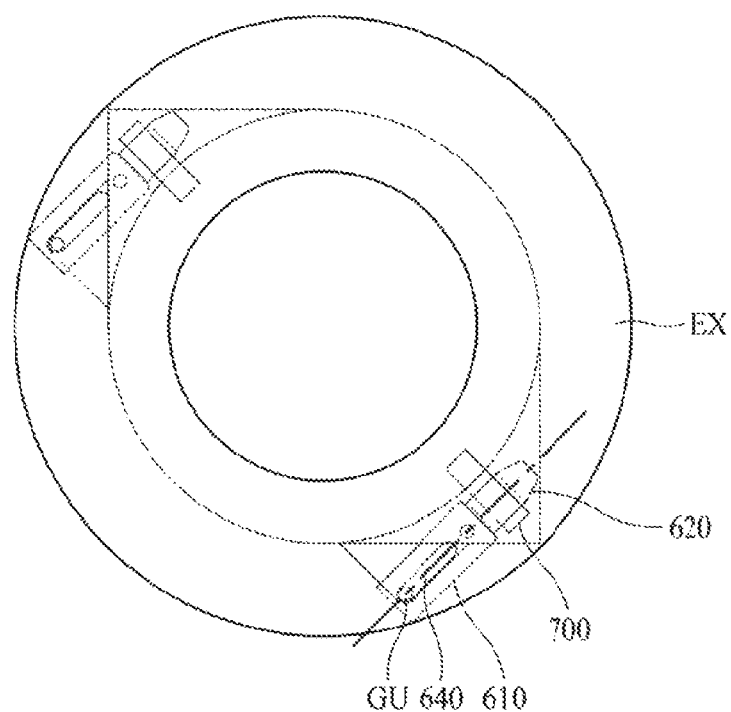
FIGS. 9A to 9C are diagrams illustrating a structure of the sound generating device at completing of the assembling process, in the display panel having the tiling coupler according to the second embodiment of the present disclosure.
Figure 9B:
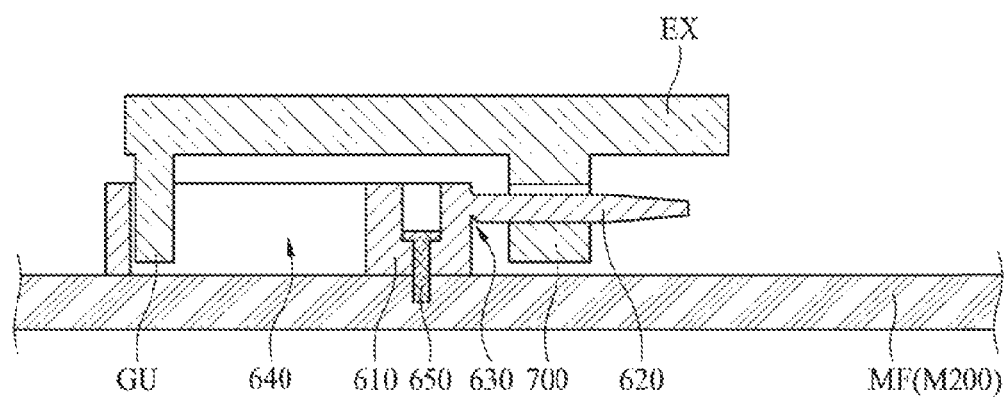
Figure 9C:
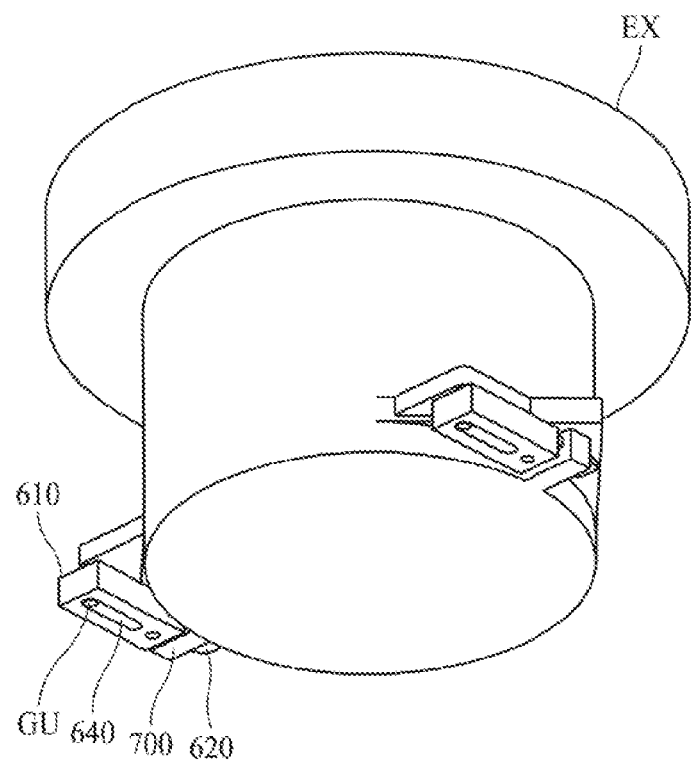

Hereinafter, referring to FIGS. 8A to 8C and 9A to 9C, a process in which the sound generating device EX is attached to the middle frame MF as assembling the display panel DP with the back frame BF and the middle frame MF will be described. FIGS. 8A to 8C are diagrams illustrating a structure of the sound generating device at starting the assembling process, in the display panel having the tiling coupler according to the second embodiment of the present disclosure. FIGS. 9A to 9C are diagrams illustrating a structure of the sound generating device at completing the assembling process, in the display panel having the tiling coupler according to the second embodiment of the present disclosure.

At first, referring to FIGS. 8A to 8C, the start status of assembly of the display panel DP to the back frame BF and the middle frame MF will be described. FIG. 8A is a plane view looking down from the top of the sound generating device EX. FIG. 8B is a side view of latch 600 looking from the side. FIG. 8C is a perspective view seen from the bottom of the sound generating device EX and the latch 600.

The assembly start status can be same with a status as shown in FIG. 5A. For example, the position adjustment element 200 can be disposed on the height adjustment element 100 being not matched with each other at a predetermined distance. In detail, the assembly start status can be the status in which the extrusion 330 of the position limiter 300 can be inserted into the base hole 130 of the height adjustment element 100, and the position adjusting hole 230 of the position adjustment element 200 can be placed at the one end based on the extrusion 330. Here, the latch hole 720 of the latch holder 700 can be disposed with a predetermined distance from the clasp 620 of the latch 600. For example, the tip part 623 of the clasp 620 can be located from the latch hole 720 with a predetermined distance. In addition, the guide protrusion GU prepared at the lower portion of the sound generating device EX can be inserted into one end of the rail member 640.

Next, referring to FIGS. 9A to 9C, the status in which the display panel DP is assembled to the back frame BF and the middle frame MF will be described. FIG. 9A is a plane view looking down from the top of the sound generating device EX. FIG. 9B is a side view of latch 600 looking from the side. FIG. 9C is a perspective view seen from the bottom of the sound generating device EX and the latch 600.

The assembly completion status can be same with a status as shown in FIG. 5B. As moving the display panel DP, the position adjusting hole 230 moves to other end based on the extrusion 330, and then the disposed location of the position adjustment element 200 can be determined on the height adjustment element 100. Here, the guide protrusion GU can move to the other end along the rail member 640, and the latch hole 720 of the latch holder 700 can be engaged with the clasp 620 of the latch 600, so that the sound generating device EX can be fixed to the middle frame MF.

In detail, as shown in FIGS. 5A and 5B, the guide protrusion GU can be inserted into the rail member 640 and moved in the process of assembling the display panel DP with the back frame BF, so that the sound generating device EX can be moved to linearly correctly. Accordingly, in the process of assembling, the clasp 620 can be accurately coupled with the latch hole 720 without hitting the surroundings or any interference.

Since the rail member 640 is an induction path through with the guide protrusion GU provided in the sound generating device EX moves, as shown in FIG. 5A, when the display panel DP is installed at an initial position, the guide protrusion GU can be preferably inserted at the end of the rail member 640. Further, as shown in FIG. 5B, it is preferable that the guide protrusion GU can be able to move smoothly to the other end of the rail member 640 as the display panel DP is moved to the assembly position. Accordingly, it is preferable that the length of the rail member 640 has a range larger than a range in which the display panel DP can move.

For example, the rail member 640 can have a longer length than the position adjusting hole 230 and be arranged to the same direction with the major axis of the position adjusting hole 230. When the position adjusting hole 230 is disposed in a diagonal direction of 45-225 degrees with respect to the XY plane, it is preferable that the rail member 640 is also arranged in the same diagonal direction. Further, it is preferable that the length of the rail member 640 and its range are slightly larger than the length and range of the position adjusting hole 230.

As a result, when the extrusion 330 of the position limiter 300 is inserted into the base hole 130, the guide protrusion GU of the sound generating device EX can be inserted into the rail member 640. As the display panel DP is moved, the position adjusting hole 230 moves with respect to the extrusion 330 of the position limiter 300, at the same time, the guide protrusion GU of the sound generating device EX is also moved within the range of rail member 640. As the display panel DP is located at the correct position on the XY plane, the guide protrusion GU is also located within the rail member 640, and the clasp 620 of the latch 600 is engaged with the latch hole 720 of the latch holder 700.

When a specific display panel DP is to be separated after assembling as in the second embodiment, it can be separated in the same way described as in the first embodiment. Using a disassembling device including a vacuum absorber and/or the permanent magnets, the specific display panel DP to be disassembled can be separated in the vertical direction, i.e., +Z direction. At this time, the clasp 620 of the latch 600 fixing the sound generating device EX with the middle frame MF can be broken. Particularly, due to the breaking part 630 formed between the clasp 620 and the base body 610, a breakage by the external force can be accurately and easily performed.

In the second embodiment, a large display apparatus can be manufactured by applying the tiling assembly method to a plurality of display panels DP. In particular, by providing the sound generating device EX in some display panels DP, a large display apparatus providing sound information together with the image information can be presented without any additional speaker system.

By adjusting the height of each display panel DP constituting the large display apparatus to form the same surface plane, the seams are not recognized, it is possible to provide the high quality image information. Moreover, when a problem occurs in any one specific display panel, it is very easy to reassemble new one after selectively removing and repairing only the specific display panel without disassembling all display panels.

Features, structures, effects and so on described in the above described examples of the present disclosure are included in at least one example of the present disclosure, and are not necessarily limited to only one example. Furthermore, features, structures, effects and so on exemplified in at least one example of the present disclosure can be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
   a display panel;
   a back frame configured to attach to a wall structure by a fixing element;
   a height adjustment element joined to the back frame, the height adjustment element including a permanent magnet and adjusting a height;
   a position adjustment element fixed to a rear surface of the display panel, the position adjustment element including a magnetic material mounted by a magnetic force of the height adjustment element, and adjusting a position on a plane defined by the height adjustment element;
   a position limiter engaged between the position adjustment element and the height adjustment element;
   a sound generating device disposed at a rear surface of the display panel and having a latch holder;
   a middle frame disposed between the height adjustment element and the position adjustment element, and including a space receiving the sound generating device; and
   a latch disposed at an inner side of the middle frame to engage with the latch holder.

2. The display apparatus according to claim 1, wherein the latch holder includes:
   a latch hole receiving the latch; and
   a pedestal contacting a bottom surface of the latch under the latch hole.

3. The display apparatus according to claim 1, wherein the latch includes:
   a base body fixed at a bottom surface of the inner side of the middle frame; and
   a clasp extruded from the base body in a horizontal direction.

4. The display apparatus according to claim 3, further comprising:
   a breaking part formed between the base body and the clasp.

5. The display apparatus according to claim 1, wherein a distance between the rear surface of the display panel and the inner side of the middle frame corresponds to a height of the sound generating device.

6. The display apparatus according to claim 5, wherein the latch holder is disposed as being apart from the latch, when the position adjustment element is disposed as being apart from the height adjustment element, and wherein the latch holder is engaged with the latch and the sound generating device is fixed to the middle frame, when the display panel is moved to settle the position adjustment element at a correct position on the height adjustment element.

7. The display apparatus according to claim 6, wherein the display panel and the sound generating device are disassembled from the middle frame as breaking the latch, when separating the display panel from the middle frame in a vertical direction.

8. The display apparatus according to claim 5, wherein the sound generating device includes a guide protrusion disposed around the latch holder, and
   wherein the latch further includes a rail member receiving the guide protrusion, the guide protrusion moving within the rail member.

9. The display apparatus according to claim 8, wherein the latch holder is disposed as being apart from the latch, and the guide protrusion is inserted into one end of the rail member, when the position adjustment element is disposed as being apart from the height adjustment element, and
   wherein the latch holder is engaged with the latch and the sound generating device is fixed to the middle frame, and the guide protrusion is moved to another end of the rail member, when the display panel is moved to settle the position adjustment element at a correct position on the height adjustment element.

10. The display apparatus according to claim 9, wherein the display panel and the sound generating device are disassembled from the middle frame as breaking the latch, when separating the display panel from the middle frame in a vertical direction.

11. The display apparatus according to claim 1, wherein the position adjustment element includes:
    an attaching surface fixed to the display panel;
    a position adjusting surface protruded from the attaching surface toward the height adjustment element;
    a position limiting hole disposed at the position adjusting surface; and
    an adjusting chamber disposed between the attaching surface and the position adjusting surface,
    wherein the position limiter includes:
    a head mounted in the adjusting chamber;
    an extrusion protruded from a center portion of a bottom surface of the head; and
    a cushion attached on an upper surface of the head,
    wherein the position limiting hole has a diameter that is smaller than the head and larger than the extrusion, and
    wherein the extrusion is configured to penetrate the position limiting hole and to be inserted into the base hole.

12. The display apparatus according to claim 11, wherein the position adjusting hole includes an oval shape having a major axis and a minor axis,
    wherein the minor axis has a minor length that is the same as a diameter of the extrusion, and
    wherein the major axis has a major length larger than the diameter of the extrusion, and is disposed at a diagonal direction on a surface of the display panel.

13. The display apparatus according to claim 12, wherein the latch holder is disposed as being apart from the latch, when the extrusion is inserted into the base hole, and the position limiting hole is located at one end with respect to the extrusion, and
    wherein the latch holder is engaged with the latch and the sound generating device is fixed to the middle frame, when the position limiting hole is moved to another end with respect to the extrusion to settle the position adjustment element at a correct position on the height adjustment element.

14. The display apparatus according to claim 13, wherein the display panel and the sound generating device are disassembled from the middle frame as breaking the latch, when separating the display panel from the middle frame in a vertical direction.

15. The display apparatus according to claim 1, further comprising:
   an adhesive layer disposed between an upper surface of the sound generating device and the rear surface of the display panel to attach the sound generating device to the display panel.

16. The display apparatus according to claim 1, wherein the height adjustment element has a cylindrical body having a neodymium magnetic material.

* * * * *